PROCESS FOR COATING SILICON WAFERS

Filed Jan. 30, 1967

INVENTORS
ARAM K. HAMPIKIAN
BING C. CHU
SHIH-LU CHEN

BY Sughrue, Rothwell, Mion, Zinn & Macpeak
ATTORNEYS

United States Patent Office 3,524,776

Patented Aug. 18, 1970

3,524,776

PROCESS FOR COATING SILICON WAFERS

Aram K. Hampikian, Norwalk, Conn., and Bing C. Chu and Shih-Lu Chen, Raleigh, N.C., assignors to Corning Glass Works, Corning, N.Y., a corporation of New York Filed Jan. 30, 1967, Ser. No. 612,521
Int. Cl. H01l 7/00, 7/36, 7/34
U.S. Cl. 148—189 7 Claims

ABSTRACT OF THE DISCLOSURE

A process for coating semiconductor wafers with an N- or P-type dopant by placing such semiconductors into a longitudinal reactor side-by-side, providing a dopant atmosphere and driving the dopant into each wafer by localized heat from a high frequency coil focused on each wafer in successive steps.

This invention relates to a process for coating semiconductor wafer surfaces with an N or P dopant. Specifically, this invention relates to the process of coating such semiconductor surfaces in a continuous and uniform manner through the individual heating of the wafers in a longitudinal reactor by using a high frequency coil.

Solid state diffusion is the most commonly used technique for preparing junctions in a semiconductor. One commonly employed technique is to deposit a dopant rich oxide on the semiconductor wafer, remove the said oxide after a short time, and "drive in" the impurities which have dissolved in the semiconductor to the desired depth by a heating process.

Up to the present time depositing N or P dopant on semiconductor wafers has commonly been effectuated by placing such wafers into a reactor through which a mixture of carrier gas and vapor of doping compound is passed. For example, a horizontal reactor has been employed wherein semiconductor wafers are mounted upon a quartz slab with a compound of the dopant being passed over said wafers in a horizontal fashion. If these wafers are aligned longitudinally in such a reactor tube and the doped gas flows from end to end, then electrical properties such as the sheet resistivity of the wafer produced increases along the line progressively from the end of the tube where doped gas enters to the end of the tube where the gas exits. This happens whenever the solid solubility of the dopant in the semiconductor is not reached. The reason for this phenomenon appears to be that, if the gas flows from entrance to exit, it becomes progressively depleted and a lesser amount of dopant is deposited on the surface of the semiconductor wafer as it nears the gas-exit end of the reactor tube.

In addition, as the doped gas enters the tube, it is already decomposed in the hot region before reaching the wafers. The new compound of the dopant formed during the decomposition process is believed to be partly ultramicroscopic particles which are conveyed by carrier gas toward the gas-exit end. Because of the action of gravity, these particles gradually fall down to the bottom of the tube. The further away the wafers are from the gas entry, the fewer the particles that deposit on their surfaces, so that the sheet resistivity of the deposited wafers increases toward the gas-exit end.

These disadvantages of the prior art have now been overcome by a new technique for N- or P-type coating of semiconductor wafers in a uniform manner without regard to the specific location of the silicon wafer in the reaction tube.

It is, therefore, an object of this invention to obtain N- or P-type coated semiconductor wafers which have uniform electrical properties and which can be produced continuously, being only limited by the length of the reaction chamber.

A further object of this invention is to provide a process for coating semiconductor wafers with N- or P-type dopant in a uniform manner without regard to the specific location of the wafer in the reaction tube.

Other objects, features and advantages of the invention will be apparent from the following more particular description of the preferred embodiments of the invention as illustrated in the accompanying drawings.

This invention relates to the coating of semi-conductor wafers made of silicon or germanium with N- or P-type dopant. This involves, for example, in the case of silicon semiconductors, an N- or P-type coating in a gaseous dopant atmosphere in a reactor tube essentially made of quartz while being heated internally at the situs of the reaction to a temperature of between 400–1300° C. The gaseous dopant material is diborane or phosphine, but alternatively liquid sources such as phosphorous oxychloride and boron tribromide can be employed while being carried by gases such as $O_2$ or $N_2$ and thus introduced to the reactor.

The heating of the silicon wafers located on the susceptors involves an individual heating of each and every wafer by a high frequency reactor coil moving along on the outside of the reactor where everything else is left relatively cold in the reactor except the wafer while such heating is taking place. The heating of the silicon wafer contained in the reaction tube is accomplished by an especially designed H.F. coil which has a focusing action on the H.F. field produced and thus heats only the individual susceptor upon which it is focused while surrounding the part of the reactor where the susceptor is located. The susceptor has placed thereon the silicon wafer to be "coated" by the heating action of the H.F. coil. There is also provided a "rayo-tube" which measures the temperature of the susceptor by detecting its radiation on a thermocouple device and is rigidly attached to the H.F. coil and will follow the coil and give a continuous run of information about the thermal condition of the wafer that is undergoing the reaction. As the doped gas flows from left to right, no reaction takes place in the reactor except at the position where the H.F. coil heats the susceptor and the wafer thereon. The active displacement cycle will be for the H.F. coil to be moved counter to the direction of flow of the gaseous dopant, in order that no heated wafer will ever react with an already depleted gas. Thus, there is always fresh dopant gas for a wafer ready to be "coated" and the dopant gas is always available in a uniform, homogeneous composition. Effective deposition may be accomplished by heating a wafer, supported on a susceptor, to a temperature in the range of from about 400–1300° C. for a period of from 5 to 30 minutes.

Figure 1:
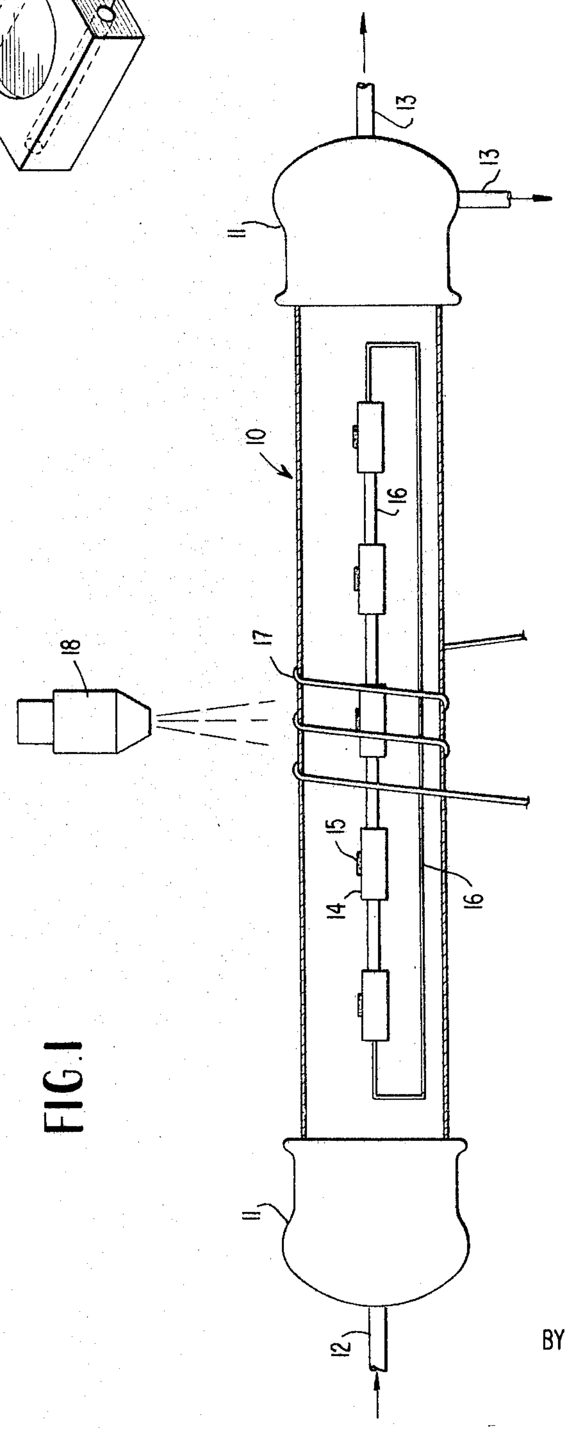
FIG. 1 is a side view of the reaction chamber with semiconductor wafers being placed on the susceptors and the high frequency coil encircling the tube.

In FIG. 1 there is shown a side view of the quartz reactor 10 with end closures 11 through which gases may enter at inlet 12 and exit at outlet 13 from the reactor. Susceptors 14 support silicon wafers 15 held in place by quartz separator and support structure 16. The high frequency (H.F.) coil 17 surrounds for heating the quartz reactor with a monitoring rayo-tube 18.

Figure 2:
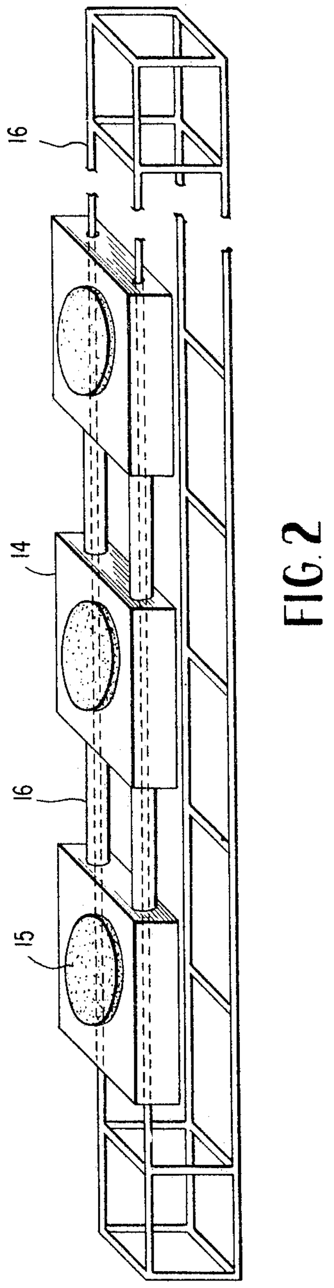
FIG. 2 is a detailed view of the susceptors and the semiconductor wafers placed thereon as separated by the quartz separators.

In FIG. 2 there is shown the supporting rods 16 part of the assembly comprising the quartz rods, the susceptor 14 and the silicon wafers 15 placed thereon.

Figure 3:
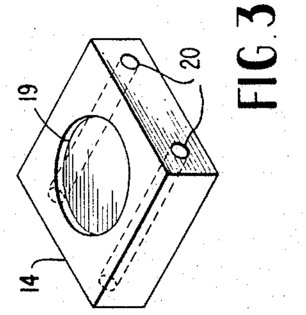
FIG. 3 shows a susceptor in detail, so as to illustrate the exact positioning of the semiconductor wafers thereon.

In FIG. 3 there is shown in detail the structure of the susceptor with a slot 19 to hold the wafer on the susceptor and holes 20 for the quartz rods to pass through the susceptor to hold it in place.

The versatility of the instant process lies in some unique features namely, that it is possible to adjust the concentration of the dopant in the carrier gas, to vary the heating cycle, or to change the power supplied by the H.F. coil while monitoring the electrical property of the wafers produced in the already cold part of the reactor to compensate for any slight difference in product quality. Thus, as the coil moves from susceptor to susceptor, the electrical property of the already coated semiconductors can be ascertained and the further semi-conductors beyond the heating station can have their atmosphere sufficiently adjusted ahead of the H.F. coil to compensate for the deficiencies of the previously coated semiconductors. This enables consistent quality control of the doped semiconducting wafers in a production line.

A further unique and versatile feature of this invention is that by employing this method, residual oxide on the surfaces of wafers may be removed by use of $H_2$, while etching of the surface of these wafers can be effected with gaseous HCl. This is very desirable because, even though the wafers have been etched and cleaned prior to their introduction into the reactor, a thin oxide layer of as little as 40 A. can bring inhomogeneous sheet resistivity reading especially for low surface concentrations.

While the instant embodiment contemplates that the coil stops over each susceptor for the heating of the susceptors, another embodiment includes moving the coil in a continuous fashion. In such other embodiment, there is the additional advantage that is not so crucial in the instant furnace method, since the important integrated value of temperature is what the wafer "sees" when the wafer is displaced from one edge of the focusing beam to the other edge thereof. Thus every part of the wafer experiences the same temperature profile. Further, since the rest of the tube is cold, monitoring devices can be introduced near the tube without the danger of being damaged by heat.

In order to provide a better understanding of the details of this process, in the following there are several examples given which are illustrative of the invention process. These examples however, are by no means limitative of the invention and are merely presented for help in describing the particular reaction involved.

EXAMPLE 1

Cleaned silicon wafers were loaded onto graphite susceptors with the latter being introduced into a quartz tube reactor from the gas-exit end of the reactor. Diborane diluted to 1% in an argon atmosphere was introduced at a rate of 20 cc./min. along with 1500 cc./min. of $N_2$ and 40 cc./min. of $O_2$. The power to the H.F. coil was then turned on and the silicon wafer on the susceptor was heated to a temperature of 1200° C. for 15 minutes. After the diborane and the power to H.F. coil were cut off, the gas mixture of $N_2$ and $O_2$ purged the reactor. The coating with diborane was then repeated for as many wafers as necessary. Following treatment of all wafers, the reactor was disassembled and the resulting silicon wafer had a sheet resistivity of 19.5 ohm/square.

EXAMPLE 2

Cleaned silicon wafers as in Example 1 were loaded into a quartz reactor. An oxygen flowrate of 30 cc./min. was introduced into the reactor along with 1400 cc./min. of $N_2$ for a few minutes. After turning off the oxygen flow, $PH_3$ diluted to 1% in an argon atmosphere was introduced at a rate of 100 cc./min. The power to the H.F. coil was turned on for 15 minutes to coat the silicon wafer at a temperature of 1000° C. Following such coating, the $PH_3$ flow and H.F. coil power were turned off. The nitrogen purged the reactor for a few minutes. Subsequent phosphine coatings were repeated for all the wafers in the reactor. After treatment, all the wafers in the reactor were removed and found to have a sheet resistivity of 6.8 ohm/square.

EXAMPLE 3

Cleaned silicon wafers of Example 1 were loaded into a quartz reactor. A nitrogen flow of 1400 cc./min. was passed through the reactor along with 200 cc./min. of $O_2$. After the power of H.F. coil was turned on for a few minutes, another flow of oxygen saturated with $POCl_3$ at 0° C. was introduced into the reactor. The coating of the wafer took place at a temperature of 1000° C. for 30 minutes. After $POCl_3$ source and the power to the H.F. coil were turned off, the later was moved to the next susceptor. Subsequent phosphine coating was repeated for all the wafers in the reactor. After treatment, all the wafers in the reactor were removed and found to have a sheet resistivity 82 ohm/square.

This invention has, for simplicity's sake, been described in terms of a limited number of materials and embodiments. The inventive concept however, is to be much broader in that other semiconductor materials may be coated in this manner, as well as other dopants may be used for effectuating similar results. It is to be understood by those skilled in the art that various changes in form, details and in the substances themselves, may be made herein without departing from the spirit and scope of this invention.

What is claimed is:

1. A continuous process for uniformly diffusing a plurality of semiconductors with a dopant, comprising placing said semiconductors into a longitudinal reactor side-by-side, providing an atmosphere containing the dopant and heating each semiconductor wafer separately in said reactor by a high frequency coil to provide localized heat and moving the coil countercurrent to the flow of said dopant containing atmosphere.

2. A process as in claim 1, wherein the dopant is diluted to 1 part of gaseous dopant in 99 parts of diffusing carrier gas.

3. A process as in claim 1, wherein the dopant is introduced into the reactor by saturating a carrier gas stream with it and passing said stream over said semiconductors.

4. A process as in claim 1 wherein the doping temperature ranges from 400–1300° C. for a period of from 5 to 30 minutes.

5. A process as in claim 1, wherein the semiconductors doped are selected from the group consisting of silicon and germanium.

6. A process as in claim 1, wherein the dopant materials are slected from the group consisting of $B_2H_6$, $BBr_3$, $PH_3$ and $POCl_3$.

7. A process as in claims 2 and 3 where prior to and after treatment with the diffusing gas there is also employed a purge stream of substantially pure nitrogen containing very minor controlled amounts of oxygen.

References Cited

UNITED STATES PATENTS

| | | | |
|---|---|---|---|
| 3,031,338 | 4/1962 | Bourdeau | 117—97 |
| 3,047,438 | 7/1962 | Marinace | 118—49.5 |
| 3,205,102 | 9/1965 | McCaldin | 148—189 |

L. DEWAYNE RUTLEDGE, Primary Examiner

R. A. LESTER, Assistant Examiner

U.S. Cl. X.R.

117—106, 107.1; 118—48, 49.5; 148—175, 188